(12) United States Patent
Seidel

(10) Patent No.: US 8,220,172 B2
(45) Date of Patent: Jul. 17, 2012

(54) RECEIVING DEVICE

(76) Inventor: Gregor Seidel, Kempten (DE)

( * ) Notice: Subject to any disclaimer, the term of this patent is extended or adjusted under 35 U.S.C. 154(b) by 210 days.

(21) Appl. No.: 12/451,298

(22) PCT Filed: May 8, 2008

(86) PCT No.: PCT/EP2008/003725
§ 371 (c)(1),
(2), (4) Date: Nov. 5, 2009

(87) PCT Pub. No.: WO2008/135293
PCT Pub. Date: Nov. 13, 2008

(65) Prior Publication Data
US 2010/0132206 A1   Jun. 3, 2010

(30) Foreign Application Priority Data
May 8, 2007   (DE) .......................... 20 2007 006 761

(51) Int. Cl.
*G01C 9/28*   (2006.01)
*G12B 5/00*   (2006.01)

(52) U.S. Cl. ........................................... 33/354; 33/333

(58) Field of Classification Search .................... 33/365, 33/370, 388
See application file for complete search history.

(56) References Cited

U.S. PATENT DOCUMENTS

| | | | |
|---|---|---|---|
| 1,506,556 A | | 8/1924 | Benedict |
| 2,845,719 A | | 8/1958 | Thomiszer |
| 5,506,759 A | * | 4/1996 | Shirai et al. ..................... 33/379 |
| 5,697,161 A | * | 12/1997 | Denley ............................ 33/288 |
| 5,806,196 A | * | 9/1998 | Gibbs et al. ..................... 33/370 |
| 6,675,490 B1 | * | 1/2004 | Krehel et al. ................... 33/382 |
| 6,818,824 B1 | * | 11/2004 | Marcou et al. ................. 33/370 |
| 7,568,292 B2 | * | 8/2009 | Maruyama ...................... 33/385 |
| 7,832,112 B2 | * | 11/2010 | Christianson ................... 33/365 |
| 2010/0115780 A1 | * | 5/2010 | Christianson ................... 33/365 |
| 2010/0315070 A1 | * | 12/2010 | Hong .............................. 33/365 |

FOREIGN PATENT DOCUMENTS

| | | |
|---|---|---|
| DE | 43 23 902 | 1/1995 |
| DE | 195 32 330 | 3/1997 |
| GB | 640785 | 7/1950 |

* cited by examiner

*Primary Examiner* — Yaritza Guadalupe-McCall
(74) *Attorney, Agent, or Firm* — Jacobson Holman PLLC

(57) ABSTRACT

A receiving device, in particular for a sensor, grading instrument or the like, including a housing with a housing upper part in which the grading instrument can be arranged. An intermediate part is provided by which a holding position and/or a mounting position can be set.

11 Claims, 3 Drawing Sheets

RECEIVING DEVICE

This is a national stage of PCT/EP08/003725 filed May 8, 2008 and published in German, which has a priority of German no. 20 2007 006 761.5 filed May 8, 2007, hereby incorporated by reference.

FIELD OF THE INVENTION

The invention refers to a receiving device in the form of a housing for a sensor, grading instrument or the like.

BACKGROUND OF THE INVENTION

In the state of the art a fastening means for a sensor or a sensor housing is known. Here for a resonance-proof design of a fastening means a fastening piece which is surrounded at least partly by an extrusion body is provided which engages at least partly in a wall of a sensor or sensor housing.

Furthermore a mounting device for sensors is known which serves for attaching a sensor with a cylinder-like designed housing to a boring of a machine part. Both solutions known from the state of the art make the production of a receiving device only with high technical effort possible, an optimum position adjustment being not possible by means of these solutions.

Known receiving devices of this kind are designed as mainly one-piece housing (M 400 00 894.7), wherein in the interior of a housing upper part a sensor is introduced. When this structural component is fixed in a mounted position the entire housing is moved on the base, wherein by means of connectors in the form of screws or the like a holding profile of the housing upper part is clutched and, after that, the provided fixing can be carried out. When receiving devices of this kind are used in customised varying mounted positions the result are expensive adaptations in order to get an optimum adjustment of the interior sensor. The one-piece housing with holding profiles formed as receiving openings for the connectors comes with a high effort and expenses for manufacturing.

SUMMARY OF THE INVENTION

Therefore the invention has the subject to create a receiving device for, in particular, grading sensors the individual parts of which can be produced with slight technical effort and can be easily assembled, while here in variable mounting positions an optimum position adjustment of in particular liquid grading sensors is possible.

The receiving device according to the invention has an essentially two-part structural component of the housing where the housing upper part connected with the sensor and an intermediate part which encircles it largely positive locking interact as a functional unit. In a mounting phase of the receiving device provided as single part before its fixing in the provided mounted position a simple swivel positioning of the housing upper part with the grading sensor is possible, and after that it is fixed by means of the positive locking intermediate part and the connectors.

With this comparatively simple, for a grading instrument support surprising construction, a number of application cases of the sensors, in particular for liquid grading sensors integrated in systems of this type, a quick and largely without any aids operable adaptation to any given incline zero position is possible.

The receiving device, which requires only a few single parts, is economically designed in such a way that the rotational symmetric housing upper part as a preform which can be simply manufactured in the way of a lid-shaped receiving cup can be directly provided with the gradient sensor, and this structural component has to be completed thereafter only at the place of assembly with the intermediate part provided as hasp flange—which is formed as a stamping or pressed piece which can be easily manufactured. Before a final fixing of the receiving device by means of straining screws or like connectors the swivelling position described before can be carried out, and thereafter the integrated sensor provides suitable measurement values starting from its set gradient zero position.

BRIEF DESCRIPTION OF THE DRAWINGS

In the following the invention will be described further by means of two embodiments shown in the drawing. In the Fig.

DETAILED DESCRIPTION OF THE PREFERRED EMBODIMENTS

Figure 1:
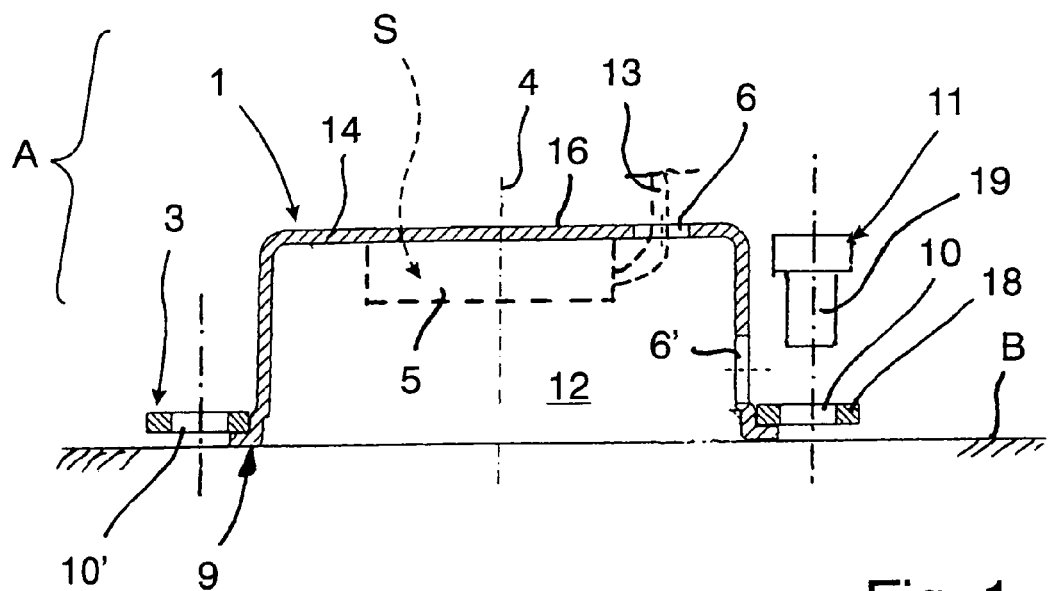
FIG. 1 a sectional view of the receiving device according to the invention according to a line 1-1 in FIG. 2, FIG. 2 a top view of the receiving device according to FIG. 1 with a housing upper part and a flange-like intermediate part, FIG. 3 a top view similar to the one of FIG. 2 with a swivelled position of the housing upper part, FIG. 4 a top view similar to the one of FIG. 2 with a swivelled position of the flange-like intermediate part, FIG. 5 a sectional view similar to the one of FIG. 1 with a floor wall part covering the housing upper part, and FIG. 6 an enlarged cutout view of the connection area of housing upper part and intermediate part.

In FIG. 1 a receiving device for a sensor S indicated in total by A is shown, the receiving device A being designed in the shape of a housing in the interior space 12 of which in particular a grading instrument designed as liquid grading sensor 5 is arranged. In the embodiment shown according to FIG. 1 the sensor S is received in a upper part 1 which can be fixed on a base B, this being fixed in the mounted position by means of respective connectors 11.

In the embodiment of the receiving device A according to the invention the housing upper part 1 formed in one piece in the way of a lid and an intermediate part 3 are provided as a functional unit. The sectional view according to FIG. 1 makes clear that the housing upper part 1 can be clutched by the intermediate part 3 in such a way that before the receiving device A is fixed finally a holding position can be set (arrow 8, FIG. 3).

Figure 2:
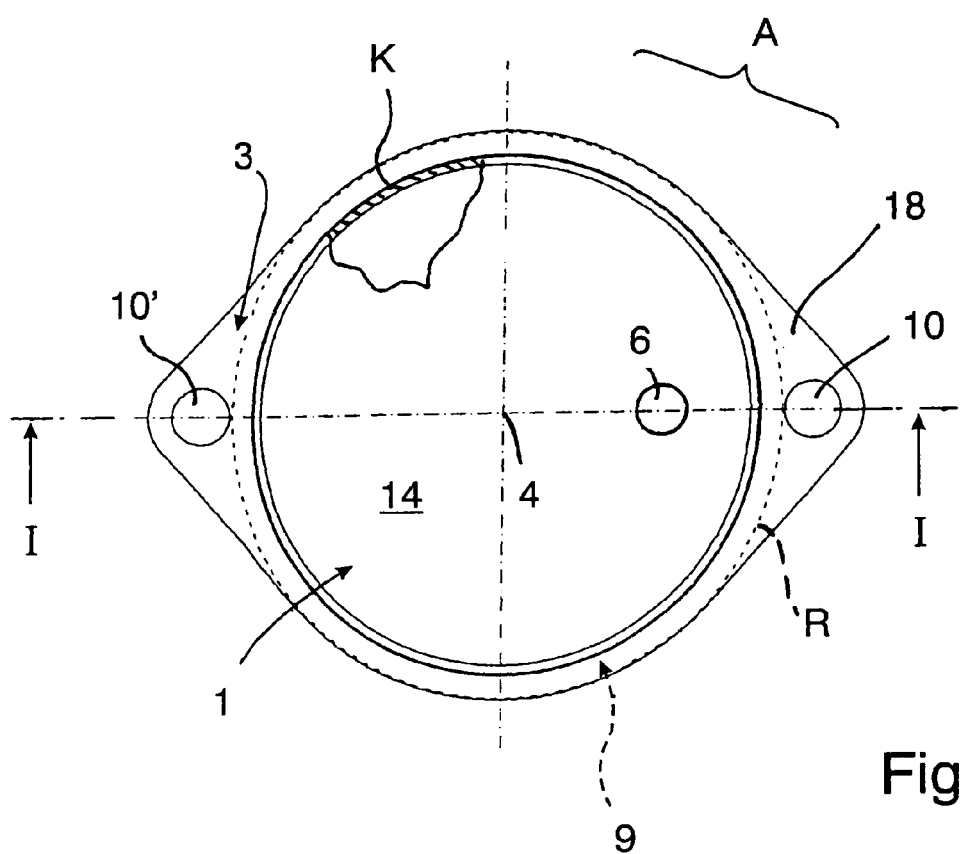

The basic view according to FIG. 1 in a combination with FIG. 2 makes clear that the housing upper part 1 is encircled positive locking by the intermediate part 3, and thus these two parts can swivel on the base B. This is achieved by supporting the intermediate part 3 loosely on the housing part 1 which is already on the base B, and thus the housing upper part 1 can be rotated with regard to the intermediate part 3 around an axis 4 according to the direction of arrow 8. The housing upper part 1 is clutched here in the area of a holding profile active as support collar 9, the sensor S is swivelled in a largely freely determined position and, after that, this pre-determined structural component is fixed by means of the intermediate part 3 with the connectors 11 on the base B.

Figure 5:
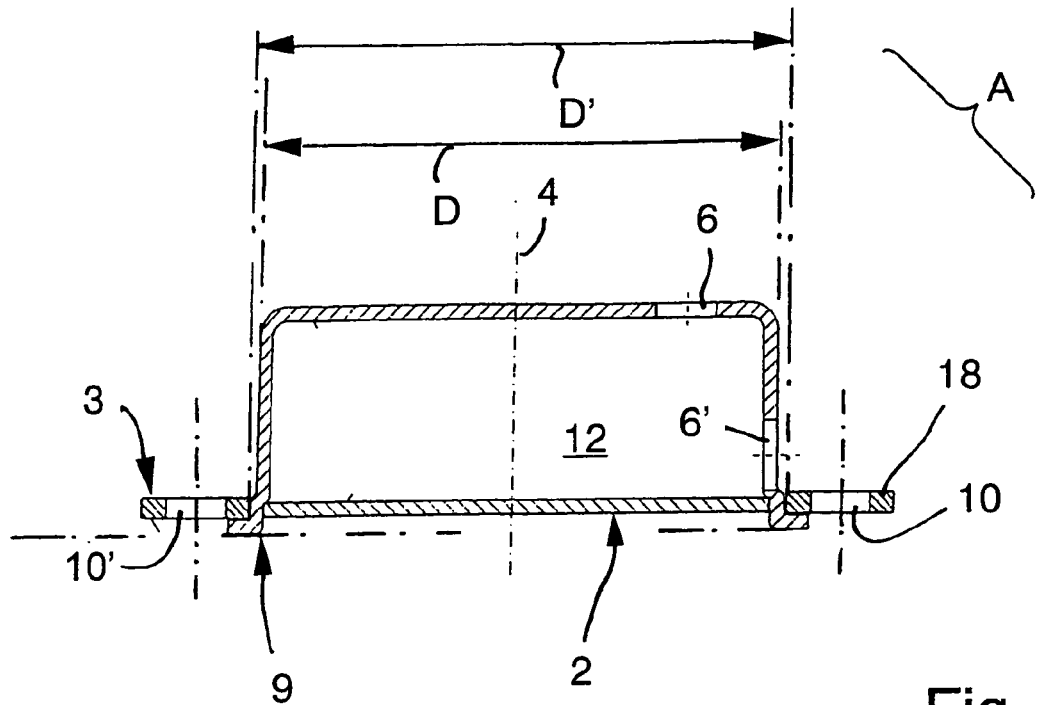
Figure 6:
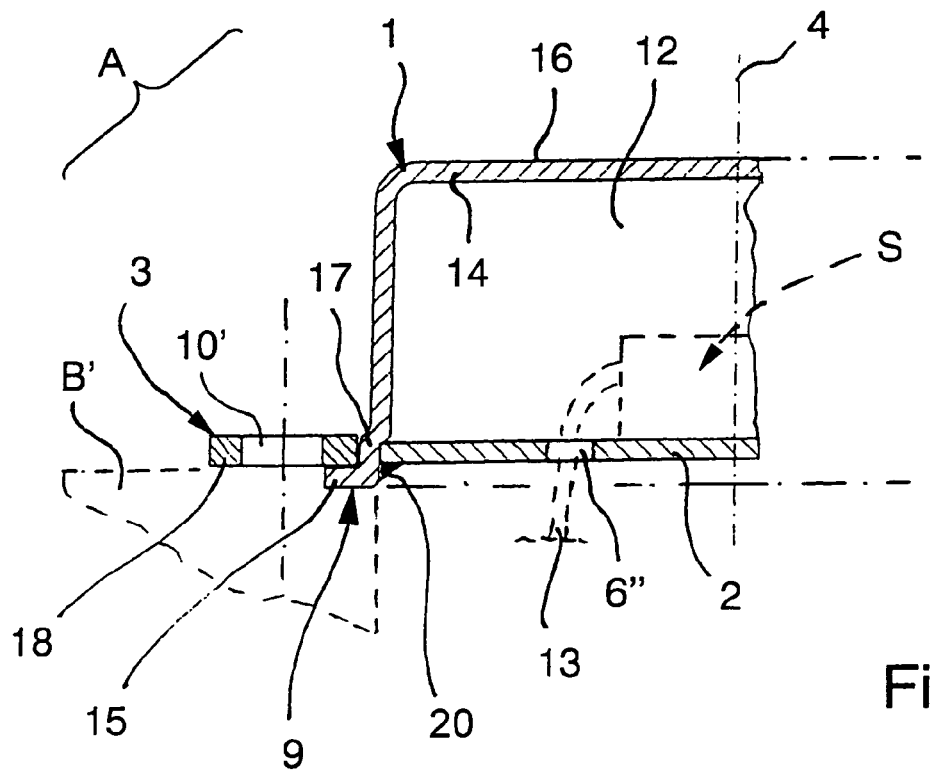

A second embodiment of the receiving device A according to FIG. 5 demonstrates that the housing upper part 1 can be provided with a part 2 of a floor wall which limits its interior space 12. Here the part 2 of a floor wall which can be connected with the housing upper part 1 can carry the sensor S (FIG. 6).

For connecting the sensor S in the receiving device A at least the housing upper part 1 is provided with a cable passage 6 so that via a line 13 a connection to an electronic evaluation means (not shown in detail) of this electronic component is established. In the same way it is possible that several cable passages 6, 6' (FIG. 1) and/or a cable passage 6" are provided in the area of the part 2 of the floor wall (FIG. 6). Furthermore it is an advantage here if in the cable passage (6, 6', 6") a sleeve, a screwed cable gland or plug-connection is arranged. It is preferably provided here to design it as antikink bush or seal.

Figure 3:
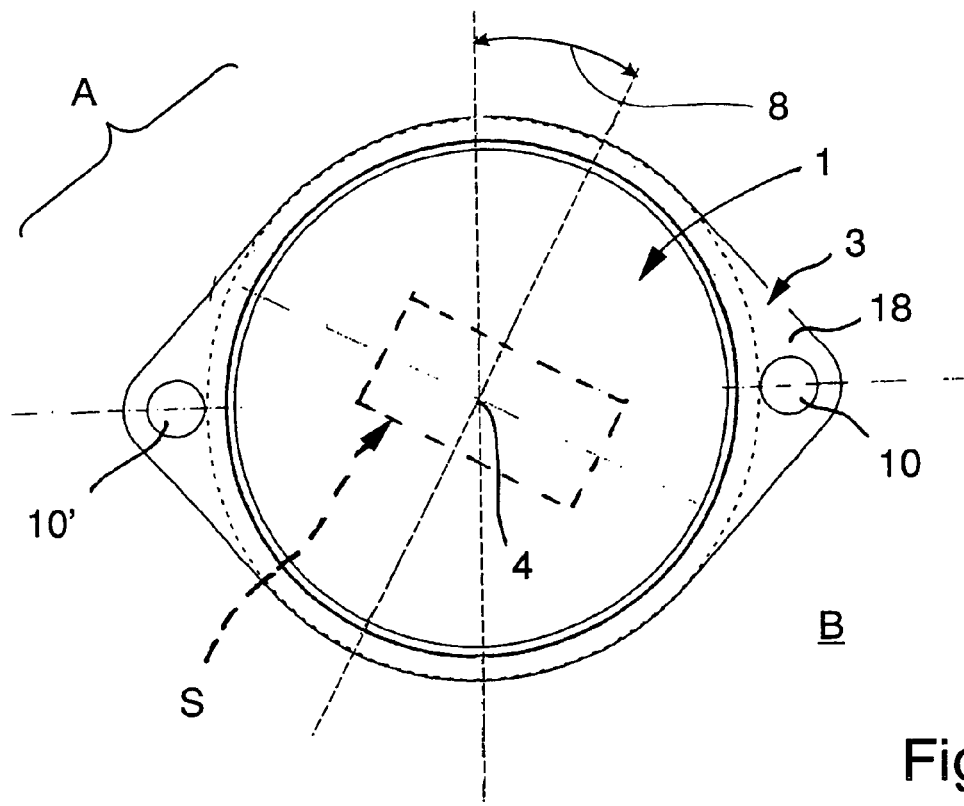
Figure 4:
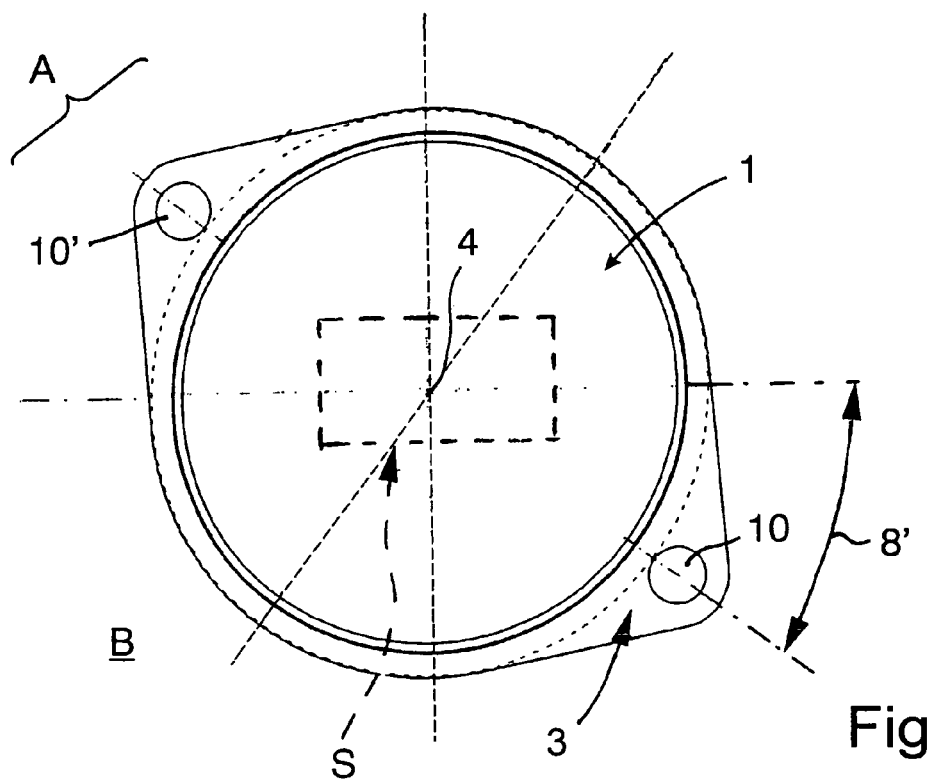

The respective top view of the housing upper part 1 according to FIGS. 2 to 4 makes clear that this is designed in an expedient embodiment as cup-shaped preform 14. It has an essentially circular circumferential edge R on which, at least in sections, a holding profile formed as support collar 9 is provided. This support collar 9 extends together with a folded collar part 15 (FIG. 6) essentially parallel to the upper wall 16 of the housing upper part 1, so that at this collar part 15 variable modifications for determining the receiving device A on the base B or B' form. In an advantageous embodiment in the area of the support collar 9 another folding 17 is formed at the diameter of which the part 2 of the floor wall is adapted in such a way that for it a limitation facing the interior space 12 during pressing in the connection position is formed.

In the top views according to FIGS. 2 to 4 it also becomes apparent that the intermediate part 3 is designed as a hasp flange 18 adapted essentially to the circular ring cross section a shape of the housing upper part 1, the hasp flange 18 having an interior diameter D' which is at least slightly larger than the diameter D of the housing upper part 1. The hasp flange 18 is here a closed ring plate with two holding openings 10, 10' receiving the connectors 11. This embodiment of the hasp flange 18 can particularly easily be manufactured in the shape of a stamping or the like. It is also possible for the hasp flange 18 to be formed of two essentially mirror symmetric half shells or to be made in the way of clamping claws (not shown). In another embodiment of the hasp flange 18 it is possible for it to be designed in such a way that a catching connection with the support collar 9 of the housing upper part 1 or a catching connection in the area of the base B is reached (not shown). Instead of the holding openings 10, 10' shown in FIG. 1 also thread borings (not shown in detail either) are possible.

It is essential for this component connection that the complete receiving device A is attached to the base B by means of respective connectors 11 which are designed as screw connectors 19 and penetrate through the holding openings 10, 10'. In a connection phase in which the screws 19 are still loose the parts of the receiving device A can be rotated in such a way that the sensor S integrated in the housing upper part 1 produces the desired signal (arrow 8, FIG. 3). If the screws are tightened the sensor S cannot be turned in another position anymore. By means of this in a grading sensor designed in particular as liquid grading sensor 5 any grading zero position can be set, wherein by releasing the screws also resets and/or readjustments are possible. It is also possible for the intermediate part 3 to be turned for reaching an optimal fixing position (arrow 8', FIG. 4).

In an expedient embodiment the housing upper part 1 with the sensor 5 integrated therein is maximum protected against environmental influences. For that in a simple embodiment the sensor parts can be moulded in the housing upper part 1 so that the plate-like floor wall part 2 can be deleted (FIG. 1). In the embodiment illustrated according to FIG. 5 the part 2 of the floor wall is added by a fit in the area of the folding 17 to the housing upper part 1, a screw connection (not shown) or connection 20 designed as glue seam or welding seam being also possible.

If here, on closer examination, in particular also of the relevant prior art, it turns out that one or the other feature may be convenient for the object of the invention, however, not decisively important, of course, already now a formulation is striven for which does not contain anymore such a feature, in particular in the main claim.

Furthermore it has to be taken into consideration that the embodiments and modifications of the invention described in the different examples and shown in the figures can be combined with each other in any way. Here single or several characteristics can be exchanged at will. These combinations of characteristics are also disclosed.

References in the sub-claims relate to the further design of the matter of the main claim through the characteristics of the respective sub-claim. These are, however, not to be understood as a waiver of independent protection of the matter for the characteristics of the referred sub-claims.

Characteristics only disclosed in the description so far may now, in the course of proceedings, be claimed as being of inventive relevance, for example to distinguish from the prior art.

Characteristics only disclosed in the description or even single characteristics of claims comprising a number of characteristics may be taken over in the first claim at any time to distinguish from the state of the art, and this is even if such characteristics have been mentioned in connection with other characteristics, and achieve particularly convenient results in connection with other characteristics, respectively.

The invention claimed is:

1. A receiving device, for a grading instrument, comprising a housing with a housing upper part in which the grading instrument is arranged, an intermediate part provided by which a holding position and/or mounting position is set, the housing upper part being connected on an inside with the grading instrument configured as a sensor as well as on an outside in an area of a support collar by the intermediate part set to a position predetermined by the sensor and fixed on a base by the intermediate part having at least one connector, the housing upper part formed as a lid being embraced in a positive locking by the intermediate part, and the intermediate part and the housing upper part being swivelled on the base individually or together.

2. The receiving device according to claim 1, wherein the housing upper part and the intermediate part are fixed in a mounting position, and/or the grading instrument is fixed by the at least one connector in the mounting position.

3. The receiving device according to claim 1, wherein the housing upper part is provided with a floor wall limiting an interior, and/or the floor wall which is connected with the housing upper part carries the grading instrument.

4. The receiving device according to claim 1, wherein the housing upper part is a cup-shaped structural part on a circumferential edge of which at least in sections the support collar is provided.

5. The receiving device according to claim 1, wherein the intermediate part is a hasp flange which is adjusted essentially to a circular ring-shaped cross section contour of the housing upper part.

6. The receiving device according to claim 5, wherein the hasp flange is a closed ring plate with at least one holding opening receiving the at least one connector, and the hasp flange is formed by two essentially mirror symmetric half shells.

7. The receiving device according to claim 5, wherein the hasp flange is a closed ring plate with at least one holding opening receiving the at least one connector, and the hasp flange catches with the support collar of the housing upper part and/or in the area of the base.

8. The receiving device according to claim 1, wherein the intermediate part is a clamping claw.

9. The receiving device according to claim 1, wherein a floor wall part is provided and the part of the floor wall designed as a floor plate is fixed in a short range of the support collar at an inside of the housing upper part by one of a press, weld screw connection.

10. The receiving device according to claim 1, wherein the at least one connector are screw connectors fixing the intermediate part on the base.

11. The receiving device according to claim 1, wherein the grading instrument is a liquid grading sensor, and is held in the housing upper part by moulding material.

* * * * *